United States Patent [19]

Tsutahara et al.

[11] Patent Number: 5,425,812
[45] Date of Patent: Jun. 20, 1995

[54] REACTION CHAMBER FOR A CHEMICAL VAPOR DEPOSITION APPARATUS AND A CHEMICAL VAPOR DEPOSITION APPARATUS USING SUCH A REACTION CHAMBER

[75] Inventors: Koichiro Tsutahara; Toru Yamaguchi, both of Hyogo; Taizo Ejima; Toshihiko Minami, both of Fukuoka; Yoshinobu Kawata, Fukuoka, all of Japan

[73] Assignee: Mitsubishi Denki Kabushiki Kaisha, Tokyo, Japan

[21] Appl. No.: 82,868

[22] Filed: Jun. 29, 1993

[30] Foreign Application Priority Data

Sep. 10, 1992 [JP] Japan .................................. 4-241938

[51] Int. Cl.⁶ ............................................. C23C 16/00
[52] U.S. Cl. ....................... 118/725; 118/215; 118/733
[58] Field of Search ......................... 118/715, 725, 733

[56] References Cited

U.S. PATENT DOCUMENTS

| | | | |
|---|---|---|---|
| 4,977,855 | 12/1990 | Ohmi et al. | 118/722 |
| 5,076,207 | 12/1991 | Washitani et al. | 118/725 |
| 5,166,856 | 11/1992 | Liporace et al. | 361/230 |
| 5,304,247 | 4/1994 | Kondo et al. | 118/715 |
| 5,328,513 | 7/1994 | Suzuki et al. | 118/715 |
| 5,338,363 | 8/1994 | Kawata et al. | 118/725 |

FOREIGN PATENT DOCUMENTS

4142877A1 7/1991 Germany .

*Primary Examiner*—Olik Chaudhuri
*Assistant Examiner*—Brian K. Dutton
*Attorney, Agent, or Firm*—Lowe, Price, LeBlanc & Becker

[57] ABSTRACT

The main feature of the present invention is to provide a reaction chamber for a chemical vapor deposition apparatus improved to achieve a uniform film deposition of high accuracy stably. The apparatus includes a wafer heating stage 28 for holding a wafer 14 with the surface downwards and for heating the wafer 14. The wafer heating stage 28 rotates about the center of the stage. In a low position opposing the wafer heating stage 28, a gas supplying head 37 is provided so as to form a constant spacing region 53 for supplying reaction gas towards the wafer heating stage 28. The reaction chamber includes a reaction chamber forming member 54 surrounding in a circumferential direction the spacing region 53 between the wafer heating stage 28 and the gas supplying head 37 to establish a reaction chamber having the spacing region 53 closed. An exhaust outlet 33 is provided in the reaction chamber forming member 54 and along the whole circumference of the wafer heating stage 28, and having a configuration selected to discharge gas in the reaction chamber upwards obliquely.

7 Claims, 14 Drawing Sheets

HIGH TEMPERATURE PROCESS (SOFTENING)

HIGH TEMPERATURE PROCESS (SOFTENING)

⇩ HIGH TEMPERATURE PROCESS

REACTION CHAMBER FOR A CHEMICAL VAPOR DEPOSITION APPARATUS AND A CHEMICAL VAPOR DEPOSITION APPARATUS USING SUCH A REACTION CHAMBER

BACKGROUND OF THE INVENTION

1. Field of the Invention

The present invention generally relates to a reaction chamber for a chemical vapor deposition apparatus, and more particularly, to a reaction chamber for a chemical vapor deposition apparatus improved so that a uniform and accurate film can be grown stably for every wafer. The present invention also relates to a chemical vapor deposition apparatus using such a reaction chamber.

2. Description of the Background Art

A $SiO_2$ film is conventionally used as an interlayer insulation film of VLSI semiconductor devices such as 4M bit dynamic RAMs. In accordance with reduction of size of VLSI semiconductor devices, there has been progress in the technology of forming a PSG film and a BPSG film by doping lightly phosphorus and, phosphorus and boron. The purpose of doping lightly phosphorous and boron is to facilitate softening of an interlayer insulation film by heat to allow planarization of the surface thereof, Referring to FIG. 1A, a BPSG film 101 including B and P is formed on a substrate 100 using $SiH_4$ and $O_2$ by CVD. When thermal treatment of high temperature is applied to BPSG film 101, interlayer insulation film 101 is softened and the surface thereof is planarized.

This method of forming an interlayer insulation film using $SiH_4$ and $O_2$ gas has a problem that a void (a bubble) 102 remains in the valley of an underlying pattern 100a even if a high temperature process is carried out after film deposition because the grown film results in an overhang configuration due to increase in integration density (i.e. when the distance between patterns is reduced), as shown in FIG. 2A and 2B.

In order to solve such a problem, a method and an apparatus have been developed for an interlayer insulation film using tetraethoxy silane (abbreviated as TEOS hereinafter) which is an alcoholate type liquid source.

According to a method of forming an interlayer insulation film by a CVD method using TEOS-$O_3$, the configuration after film deposition will result in a flow configuration without an overhang, as shown in FIG. 3A and 3B. Therefore, no void (bubble) will remain in the valley of underlying pattern 100a after a treatment of high temperature even if the integration density is increased to result in an interlayer insulation film 101 having the surface planarized and of good film quality, as shown in FIG. 3B.

FIG. 4 is a plan view schematically showing a chemical vapor deposition apparatus using TEOS, and FIG. 5 is a sectional view thereof. In general, the manufacturing process of semiconductor devices is carried out in a container called a cassette in which a plurality of wafers are inserted. The apparatus shown in FIGS. 4 and 5 is one that processes wafers in the unit of cassettes. The apparatus uses three types of liquid sources including TEOS as an alcoholate type liquid source, trimethyl-ortho-phosphate (abbreviated as TMPO hereinafter) for doping and triethyl borate (abbreviated as TEB hereinafter), and $O_3$ gas and $N_2$ gas are used as a reaction gas and a carrier gas, respectively.

Referring to FIGS. 4 and 5, K1 and K2 are stages for mounting actual-product cassettes which are actually subjected to processes. K3 and K4 are stages for loading empty cassettes in which wafers subjected to a film growth process are accommodated. A belt type roller 5 serves to draw out or insert wafers one by one from a cassette mounted on cassette stages K1–K4. A wafer handling robot 6 is shown. A plurality of heating stages 7 are connected as a belt. In this conventional example, 18 plates (heating stages) are connected. By a driving motor (not shown), a drive drum 8 is rotated, whereby heating stage 7 moves towards K3 (K4) from K1 (K2). A stage heater 9 is provided under heating stage 7 to heat heating stage 7. A gas supplying head 10 is provided above heating stage 7. Gas supplying head 10 is covered with an exhaust cover 11.

Bubbling material tanks 12a, 12b, and 12c contain liquid TEOS, liquid TMPO, and liquid TEB, respectively. Bubbling material tanks 12a, 12b and 12c are heated and maintained at a temperature by a heater (not shown), a thermocouple (not shown) measuring the temperature of the liquid, and a temperature controller (not shown). Bubbling material tanks 12a, 12b and 12c have the flow of $N_2$ gas controlled and supplied via mass flow meters 13a, 13b, and 13c, respectively. Respective pipes from bubbling material tanks 12a, 12b, and 12c are combined to be connected to gas supplying head 10.

The operation thereof will be described hereinafter.

An actual-product cassette is mounted on cassette stage K1/K2. An empty cassette for accommodating a wafer that will be subjected to a growth film process is mounted on cassette stage K3/K4.

A wafer 14 is drawn out one by one from the cassette mounted on cassette stage K1 by belt type roller 5. A Bernoulli chuck 6a of wafer handling robot 6 draws up each wafer with the surface thereof upwards which is conveyed onto heating stage 7. Bernoulli chuck 6a draws wafer 14 by adsorption without coming into contact with the surface of the wafer by creating negative pressure by blowing out $N_2$ gas as shown in FIG. 6. Similarly, wafer 14 mounted on the cassette on cassette stage K2 is conveyed to heat stage 7. The heat stage 7 having two wafers 14 loaded moves in the direction towards cassette stage K3 (K4) from cassette stage K1 (K2) at a constant speed by the rotation of drive drum 8. Wafers 14 are heated by stage heater 9 and are subjected to film growth by passing under gas supplying head 10. Gas supplying head 10 is covered with exhaust cover 11. There is a space between gas supplying head 10 and exhaust cover 11. By a duct 16 connected to a discharge fan 15, the interior of exhaust cover 11 is maintained under negative pressure to prevent the reaction gas from flowing out. The wafer having a film grown by passing under gas supplying head 10 moves towards cassette stage K3 to be accommodated in a cassette mounted on cassette stage K3 or K4 by wafer handling robot 6 and belt type roller 5.

A plurality of heat stages 7 are connected as a belt. Therefore, wafer 14 can be mounted on heat stage 7 continuously by belt type roller 5 and wafer handling robot 6 as heating stage 7 is moved, resulting in a continuous film growth process of large quantity.

Reaction gas set forth in the following is supplied to gas supplying head 10. Among the three types of liquid sources, liquid TEOS will be described. $N_2$ gas is measured accurately by a mass flow meter 13a to be supplied into bubbling material tank 12a. Liquid TEOS maintained at a certain temperature is contained in bubbling material tank 12a. By bubbling $N_2$ gas in bubbling material tank 12a, $N_2$ gas is generated including TEOS gas by an amount corresponding to vapor pressure in accordance with the temperature of liquid TEOS. The $N_2$ gas including TEOS gas is sent to gas supplying head 10 by a pipe 17. Pipe 17 is heated so that the vaporized TEOS is not re-liquefied (not shown).

The other liquid sources TMPO and TEB are similarly vaporized by bubbling and sent to gas supplying head 10.

$O_2$ gas measured accurately by a mass flow meter 19 is supplied to an ozone generator 18. A portion of $O_2$ gas is converted into $O_3$ by ozone generator 18, whereby the same is sent to gas supplying head 10. Thus, gas supplying head 11 is supplied with $N_2$ gas including TEOS, TMPO, and TEB, and $O_2$ gas including $O_3$ which are all mixed. The mixed gas is heated and blown onto wafer 14 passing under 9as supplying head 10. A thin film is formed by chemical vapor deposition on wafer 14. The heated temperature of wafer 14 is approximately 350°–450° C.

A conventional chemical vapor deposition apparatus using TEOS 9as implemented as described above had various problems in film controllability, stability, uniformity, cost, space, processing capability, and maintenance, which will be described hereinafter.

A problem in conveying a wafer will first be described.

(1) A conventional apparatus has a plurality of heating stages 7 connected as a belt as shown in FIG. 5. This structure causes wafer 14 to be continuously provided under gas supplying head 10 to be subjected to a film growth process sequentially. It was therefore impossible to grow a film under different conditions for each wafer. The two wafers 14 mounted on heating stage 7 could also be processed by only the same condition. The quality of thickness of a film could not be controlled by changing the conditions during the film growth.

(2) There is only one cassette stage K1 or K2 in each lane for mounting a cassette. Therefore, if there is some time period until the next cassette is loaded on cassette stage K1 or K2 after the process of a wafer, no wafer is inserted during that period to result in a loss. Because there is no cassette stage in a conventional apparatus for accommodating a monitor wafer in order to check the state of film growth periodically, the operator had to insert a monitor wafer periodically. There was also a problem of poor workability because the stage (K1, K2) for inserting a cassette and the cassette stage (K3, K4) for accommodating a film deposition processed wafer are not located in close proximity.

(3) Because the wafer is conveyed by a belt type roller and a wafer handling robot using a Bernoulli chuck method, contamination at the bottom of a wafer due to the rubber belt and lifting up foreign particles by the gas blow out occurred.

(4) Because the direction and positioning of the orientation flat of a wafer is not carried out in a conventional apparatus, the position of a wafer on the heating stage was variable, leading to an unstable film deposition condition.

There were also problems in the reaction chamber of a conventional apparatus as set forth in the following.

(1) Referring to FIG. 5, the reaction portion is not a closed structure. This means that there is spacing between heating stage 7 and exhaust cover 11. Therefore, a change in the exhaust status will cause a change in the state of the flow-in of external air, which in turn changes the gas flow in the reaction portion. This results in an unstable film deposition condition.

(2) In a conventional apparatus, the area on heating stage 7 where a wafer is not placed has an unrequired film applied thereon which is stacked into multiple layers. This multilayer will result in a thick film which is eventually peeled off. Reaction particles in the chamber will easily adhere to the peeled off film which is reduced in temperature. Such reaction particles will adhere to a wafer, causing decrease in yield. Furthermore, reaction particles adhering to the stage can not be removed just by wiping. The entire stage must be removed to have the reaction particles removed by applying wet etching such as with hydrofluoric acid. Therefore, there was a problem of poor maintenance.

(3) Heating stage 7 is made of stainless steel or nickel alloy due to the fact that it is subjected to wet etching with hydrofluoric acid. Stainless steel and nickel alloy have poor thermal conductivity, making it difficult to heat uniformly the wafer.

(4) Wafer 14 is loaded on heating stage 7 and moves in only one direction. Even if the gas flow supplied from gas supplying head 10 is not uniform, it can not be corrected. This resulted in a problem that the thickness distribution of the film formed on the wafer is not constant.

(5) Exhaust cover 11 covers only gas supplying head 10 and does not serve to control the flow of gas. Therefore, channeling and biased current of exhaust gas occurred, resulting in unstable film deposition conditions. There was also a problem that reaction gas flows into the area where heater 9 is located through the gap between adjacent heating stages connected as a belt, resulting in contamination of heater 9.

(6) Because the temperature of exhaust cover 11 is not controlled, there is a mixed portion of a low temperature portion and a high temperature portion. Therefore, a great amount of reaction products and reaction film will adhere to exhaust cover 11, leading to a problem that removal thereof is difficult.

(7) The supply opening of gas supplying head 10 has its diameter reduced in order to maintain constant the speed of blow out from each opening. Therefore, the flow rate of gas is high and the film at the surface of a wafer of the region corresponding to the position of each opening is thickly formed.

(8) In a conventional apparatus, TEOS type reaction gas and $O_3$ gas are mixed together in the cavity within gas supplying head 10. Because these gases were mixed only by relative diffusion, there was a possibility of insufficient mixing, resulting in a non-uniform film thickness.

(9) Gas supplying head 10 is influenced by the temperature to maintain the heat of heating stage 7, supply gas, exhaust gas, and exhaust cover 11, so that the inside wall could not be maintained at a constant temperature. Therefore, the reaction state of the TEOS type reaction gas and the $O_3$ gas varied. This resulted in a problem that there is deviation in the film thickness and the dopant concentration for each wafer.

The following problems were also encountered in the reaction gas supplying portion of a conventional apparatus.

(1) The amount of TEOS gas in the $N_2$ gas corresponds to the amount of vapor pressure according to the temperature of the bubbled liquid TEOS. However, there was a great change in the vapor pressure of TEOS in response to a slight change in temperature, as shown in FIG. 7. For example, if a liquid temperature of 60° C. is raised by 5° C., the vapor pressure of TEOS is multiplied by approximately 1.3, which in turn causes the TEOS concentration in the $N_2$ gas to be multiplied by approximately 1.3, resulting in a great difference in film thickness.

Although the temperature of liquid TEOS in bubbling material tank 12a is controlled by a thermal couple and a temperature controller, reduction in liquid temperature occurs due to latent heat of vaporization at the time of vaporization because the carrier gas is passed through the liquid material. The system including bubbling material tank 12a, the heater and liquid TEOS is relatively great in size. Therefore, the controllability of temperature is low and the liquid can not be immediately restored from a reduced state. It was difficult to control accurately the temperature.

FIG. 8 shows the change in liquid temperature and vapor pressure according to time elapse starting from the initiation of bubbling until the end of film deposition. It is apparent from FIG. 8 that the temperature is not controlled along the target temperature, and there is a great deviation in vapor pressure. Therefore, stability in film thickness can not be expected. Such a problem occurs in the case of TMPO and TEB, leading to a problem that the film thickness and the dopant concentration are different for each wafer.

(2) Because the number of bubbling material tanks are required corresponding to the number of types of materials in a conventional apparatus, there was the problem that the cost is high and a large space is required.

SUMMARY OF THE INVENTION

In view of the foregoing, an object of the present invention is to provide a reaction chamber for a chemical vapor deposition apparatus that is improved to grow stably a uniform film of high accuracy for each wafer.

Another object of the present invention is to provide a reaction chamber for a chemical vapor deposition apparatus that is improved to reduce contamination in the reaction chamber.

A further object of the present invention is to provide a reaction chamber for a chemical vapor deposition apparatus that is improved to heat a wafer uniformly.

Still another object of the present invention is to provide of chemical vapor deposition apparatus using a reaction chamber including the above-described features.

Yet a further object of the present invention is to provide a chemical vapor deposition apparatus that is less expensive.

Yet another object of the present invention is to provide a chemical vapor deposition apparatus that does not occupy so much space.

Yet a still further object of the present invention is to provide a chemical vapor deposition apparatus that is superior in processing ability.

Yet a further object of the present invention is to provide a chemical vapor deposition apparatus that is superior in maintenance.

A reaction chamber for a chemical vapor deposition apparatus according to an aspect of the present invention includes a wafer heating stage for holding a wafer with the surface thereof downwards and for heating the heater. The wafer heating stage rotates about the center of the stage. At a low position opposing the wafer heating stage, a gas supplying head is provided to form a constant spacing region for supplying reaction gas towards the wafer heating stage. The spacing region between the wafer heating stage and the gas supplying head is surrounded in the circumferential direction by a reaction chamber forming member to establish a shield reaction chamber by the spacing region. An exhaust outlet having a configuration to discharge the gas in the reaction chamber upwards obliquely is provided in the reaction chamber forming member and along the whole perimeter of the heating stage.

A chemical vapor deposition apparatus according to another aspect of the present invention includes at least two single wafer reaction chambers for carrying out chemical vapor deposition reaction, and at least four actual-product cassette stages for accommodating a wafer to be sent to the single wafer reaction chamber. The apparatus further includes a first monitor cassette stage for accommodating a monitor wafer for inspecting periodically the state of a grown film, and a second monitor cassette stage for accommodating the monitor wafer after a film is grown. The apparatus further includes a wafer stage provided between the cassette stage and the single wafer reaction chamber for carrying a wafer therebetween. The apparatus further includes a first wafer conveying device for carrying a wafer between the cassette stage and the wafer stage, and a second wafer conveying device for carrying the wafer between the wafer stage and the single wafer reaction chamber.

The reaction chamber for a chemical vapor deposition apparatus according to one aspect has the reaction gas in the reaction chamber discharged from an exhaust outlet after colliding with the surface of a wafer and travelling horizontally along the wafer surface because the exhaust outlet is selected to have a configuration to discharge the gas in the reaction chamber upwards obliquely. Therefore, reaction gas will not remain in the reaction chamber and is promptly discharged from the exhaust outlet.

The chemical vapor deposition apparatus of the other aspect of the present invention can process a wafer efficiently with a minimum occupying area because two single wafer reaction chambers and four actual-product cassette stages are provided. The state of the grown film can easily be checked because a monitor cassette stage is provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
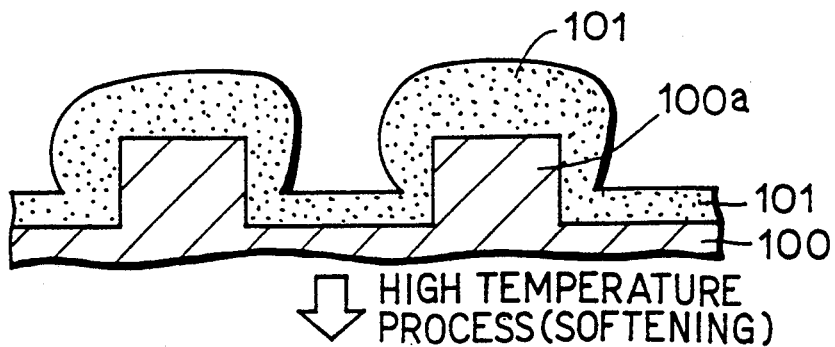
FIG. 1A and 1B are sectional view of a semiconductor device showing a step of forming a BPSG film on a substrate using $SiH_4$-$O_2$ gas.
Figure 1B:
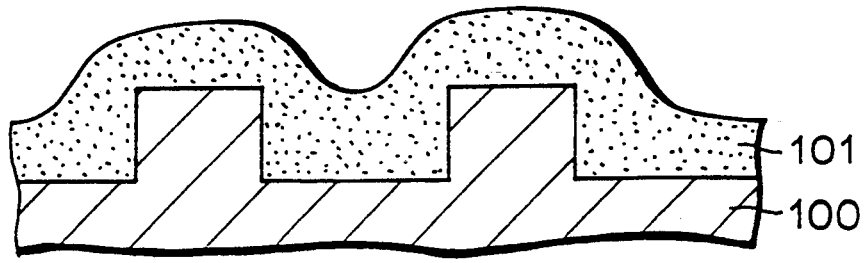
Figure 2A:
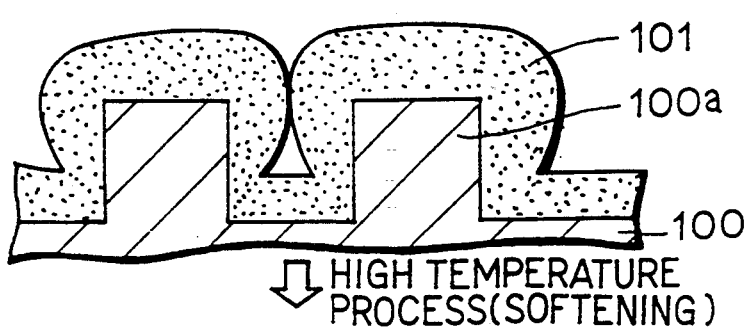
FIG. 2A and 2B are diagram showing a problem encountered in forming a BPSG film using $SiH_4$-$O_2$ gas.
Figure 2B:
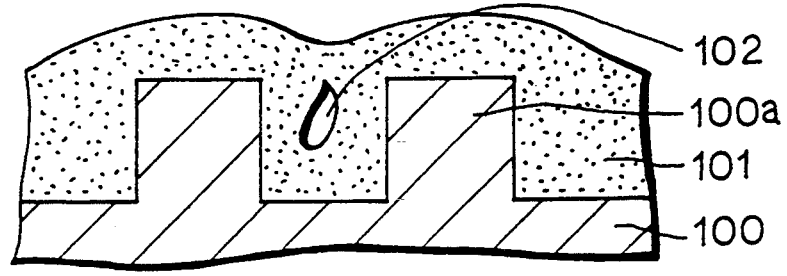
Figure 3A:
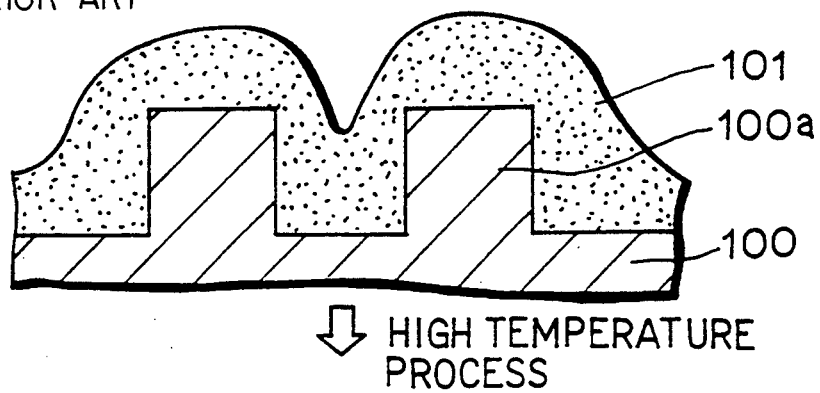
FIG. 3A and 3B are sectional view of a semiconductor device showing a step of forming an insulation film using TEOS.
Figure 3B:
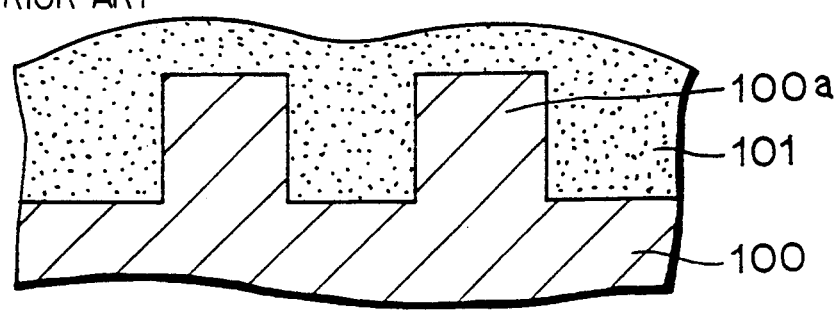
Figure 4:
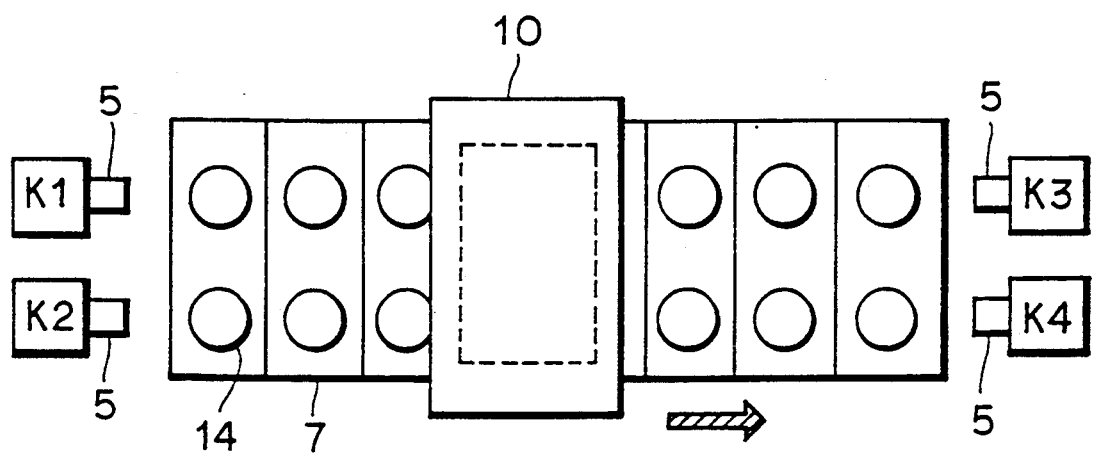
FIG. 4 is a plan view schematically showing a conventional chemical vapor deposition apparatus using TEOS.
Figure 5:
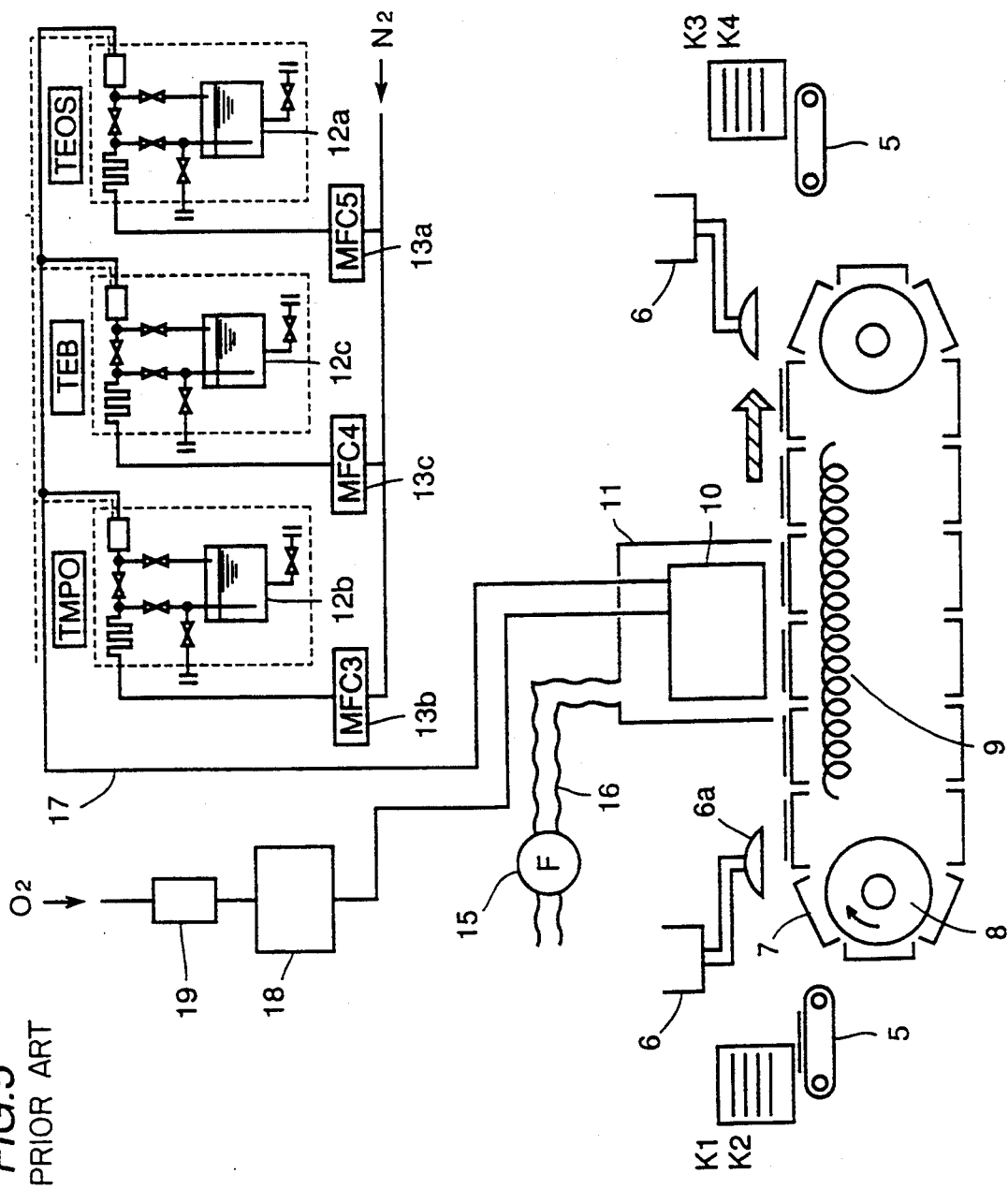
FIG. 5 is a side view of the conventional chemical vapor deposition apparatus of FIG. 4.
Figure 6:
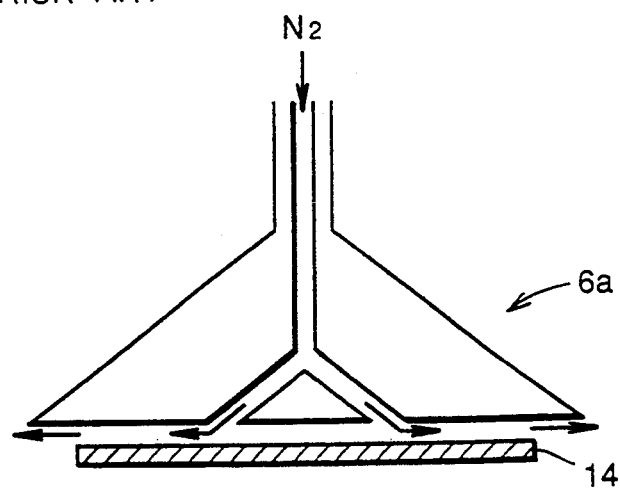
FIG. 6 is a side view of a Bernoulli chuck used in a conventional chemical vapor deposition apparatus.
Figure 7:
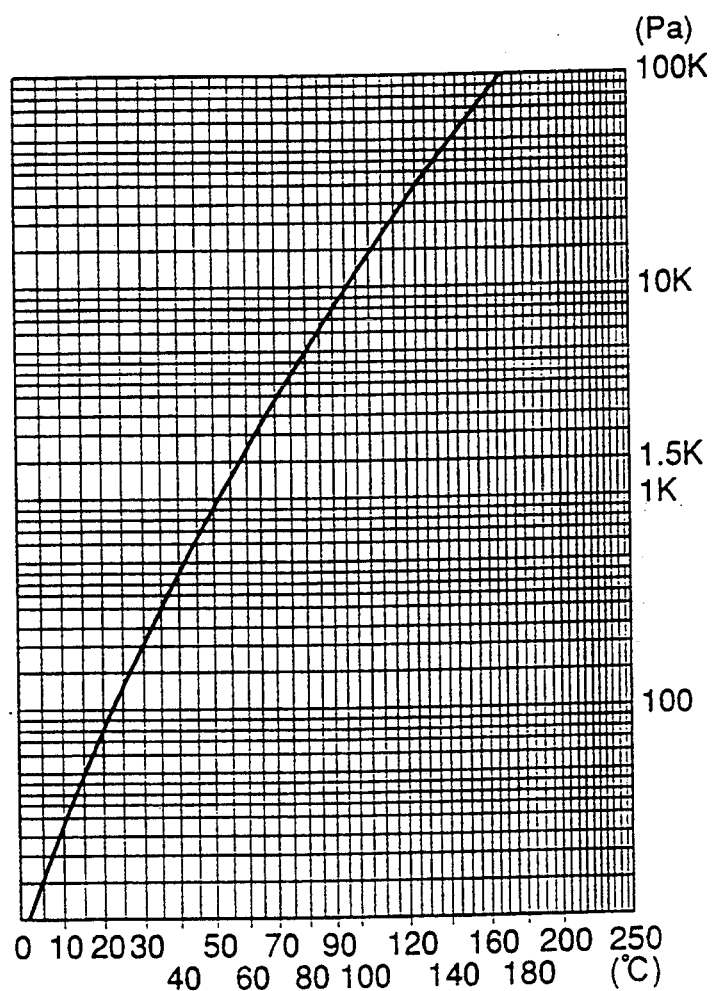
FIG. 7 is a vapor pressure curve of liquid TEOS.
Figure 8:
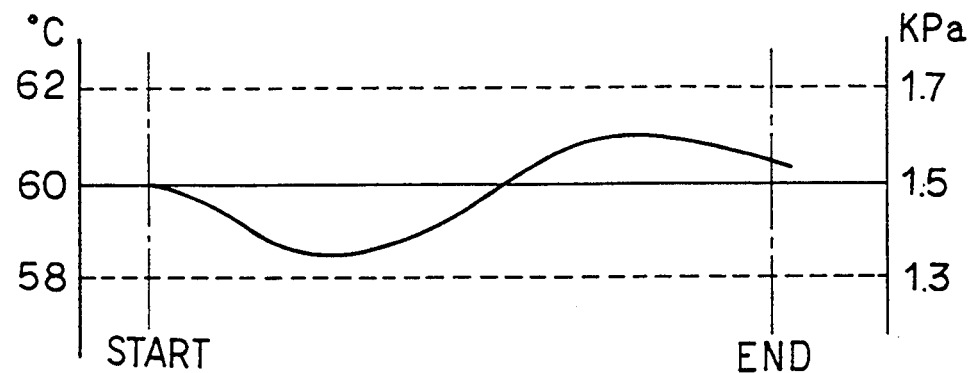
FIG. 8 is a graph showing the relationship between time and temperature in bubbling in a conventional chemical vapor deposition apparatus.
Figure 9:
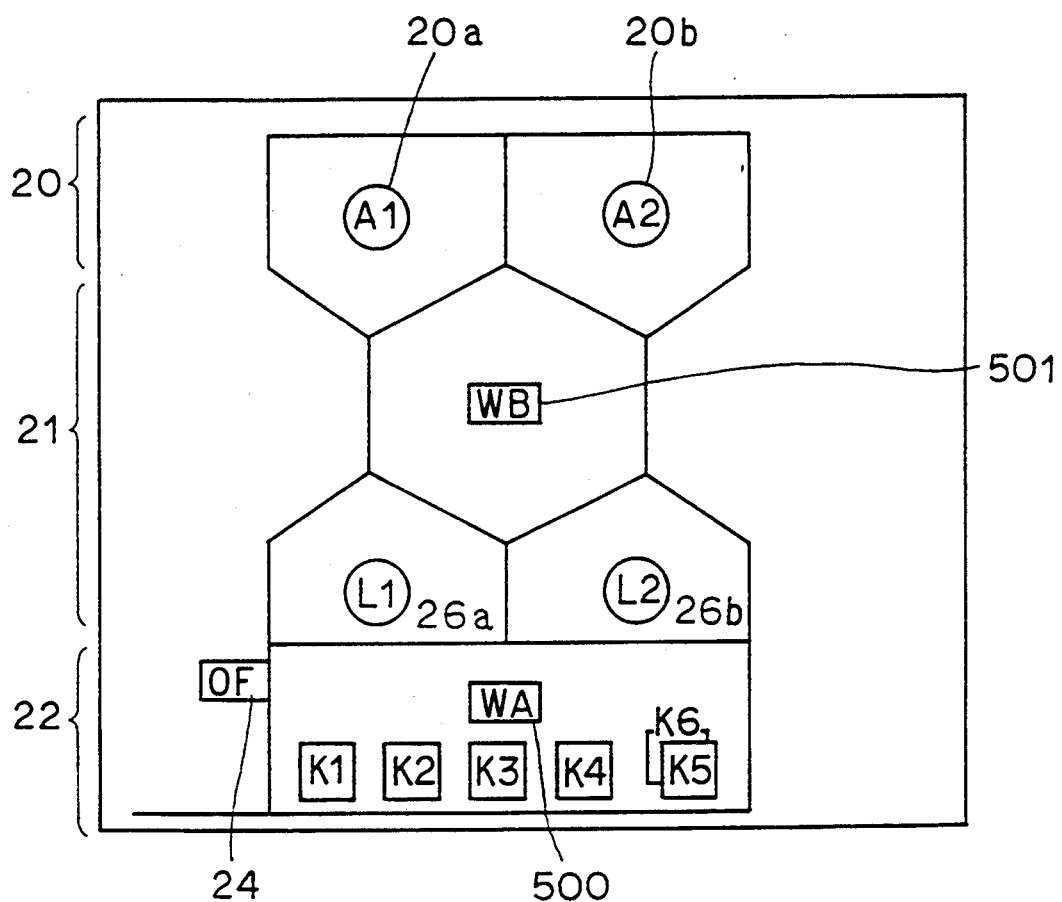
FIG. 9 schematically shows a chemical vapor deposition apparatus according to an embodiment of the present invention.

FIG. 9 schematically shows a chemical vapor deposition apparatus according to an embodiment of the present invention. The manufacturing process of a semiconductor device is carried out by a container called a cassette having a plurality of wafers inserted. The present apparatus processes a wafer in the unit of cassettes.

Referring to FIG. 9, the apparatus includes a chamber unit 20, a wafer handling unit 21, and a cassette station unit 22. Two single wafer reaction chambers 20a and 20b for applying a film growth process for each wafer are provided in chamber unit 20. In cassette station unit 22, four actual-product cassette stages K1, K2, K3, and K4 are disposed for accommodating wafers to be sent to the single wafer reaction chambers 20a and 20b. A first monitor cassette stage K6 for accommodating a monitor wafer to inspect periodically the state of a disposed film and a second monitor cassette stage K5 for accommodating a monitor wafer after deposition of a film are disposed in cassette station unit 22. The first monitor cassette stage K6 and the second monitor cassette stage K5 have a two-story structure. The monitor wafer accommodated in the second monitor cassette stage K5 is provided to measure the film thickness and the like. In cassette station unit 22, means 24 for determining the orientation flat direction and position of a wafer is disposed.

Figure 10:
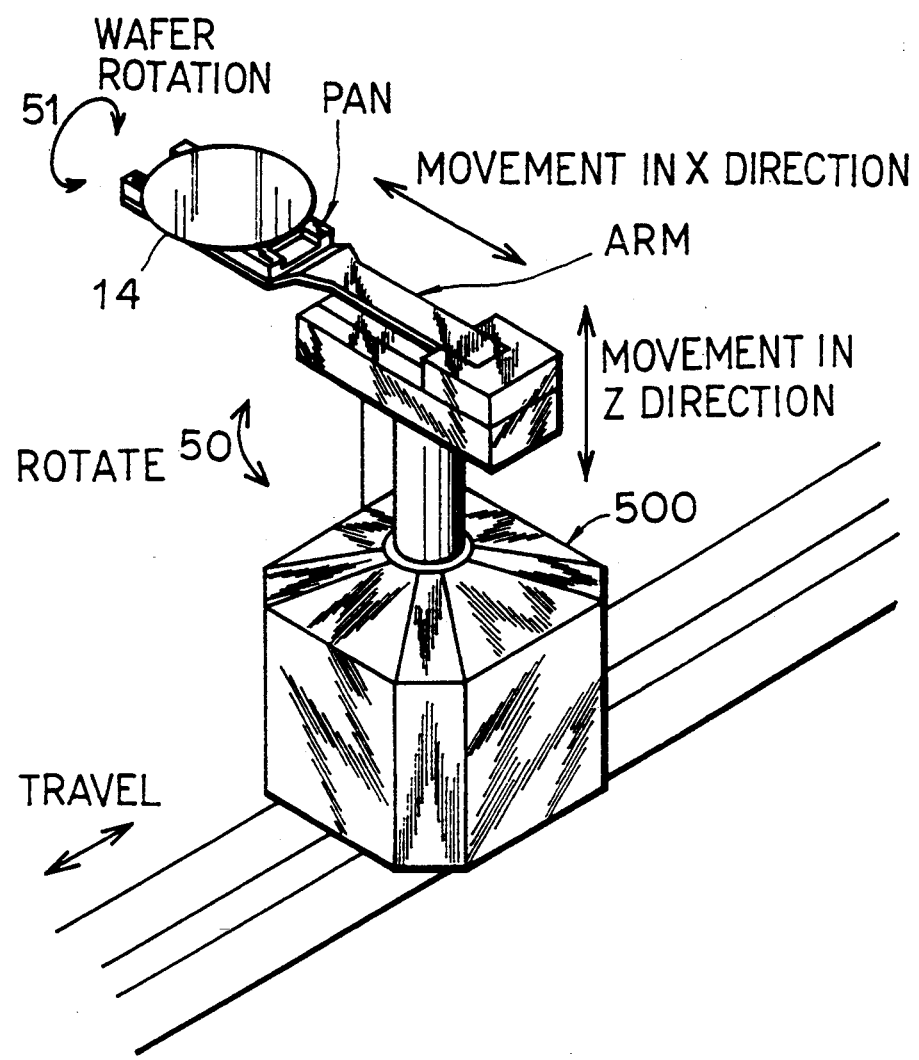
FIG. 10 is a perspective view of a wafer conveying robot WA used in a chemical vapor deposition apparatus according to an embodiment of the present invention.

A wafer convey robot WA 500 shown in FIG. 10 is disposed in front of cassette stages K1–K6. Referring to FIG. 10, wafer convey robot WA 500 includes a function for traversing in front of cassette stages K1–K6, a function for moving wafer 14 in a vertical direction (in Z direction), a function for rotating in the direction of arrow 50, a function for moving wafer 14 in a horizontal direction (X direction) and a function for rotating wafer 14 in the direction of arrow 51.

Figure 11:
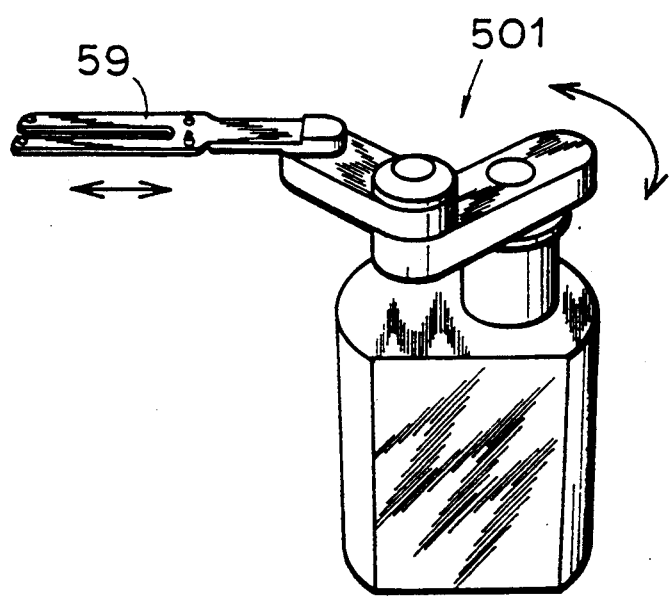
FIG. 11 is a perspective view of another wafer conveying robot WB used in a chemical vapor deposition apparatus according to an embodiment of the present invention.
Figure 12:
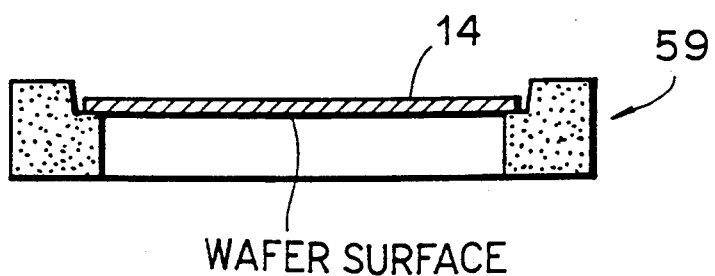
FIG. 12 is a sectional view of a pan for holding a wafer.

Wafer stages 26a and 26b are disposed in wafer handling unit 21 for carrying a wafer between cassette stages K1–K6 and single wafer reaction chambers 20a and 20b. A wafer convey robot WB 501 having an extensible arm for handling a wafer to single wafer reaction chambers 20a and 20b is provided in wafer handling unit 21. Wafer convey robot WB 501 has an extensible arm using the mechanism of a parallel link as shown in FIG. 11 to allow rotation and direction change within a small robot chamber to carry a wafer between the two single wafer reaction chambers 20a and 20b and wafer stages 26a and 26b. A wafer pan 59 for holding a wafer holds the peripheral edge of a wafer 14 with the surface downwards without touching the surface of the wafer product, as shown in FIG. 12.

Referring to FIG. 9 again, the two wafer stages 26a and 26b are buffer stages exclusively for conveying a wafer to and from single wafer reaction chambers 20a and 20b, respectively. When a wafer is conveyed from a buffer stage (26a, 26b) to single wafer reaction chambers 20a and 20b, the surface of the wafer is always downwards. Wafer stages 26a and 26b each have a structure identical to that shown in FIG. 12, whereby a wafer is held with the surface thereof downwards without touching the surface which will become the wafer product.

Figure 13:
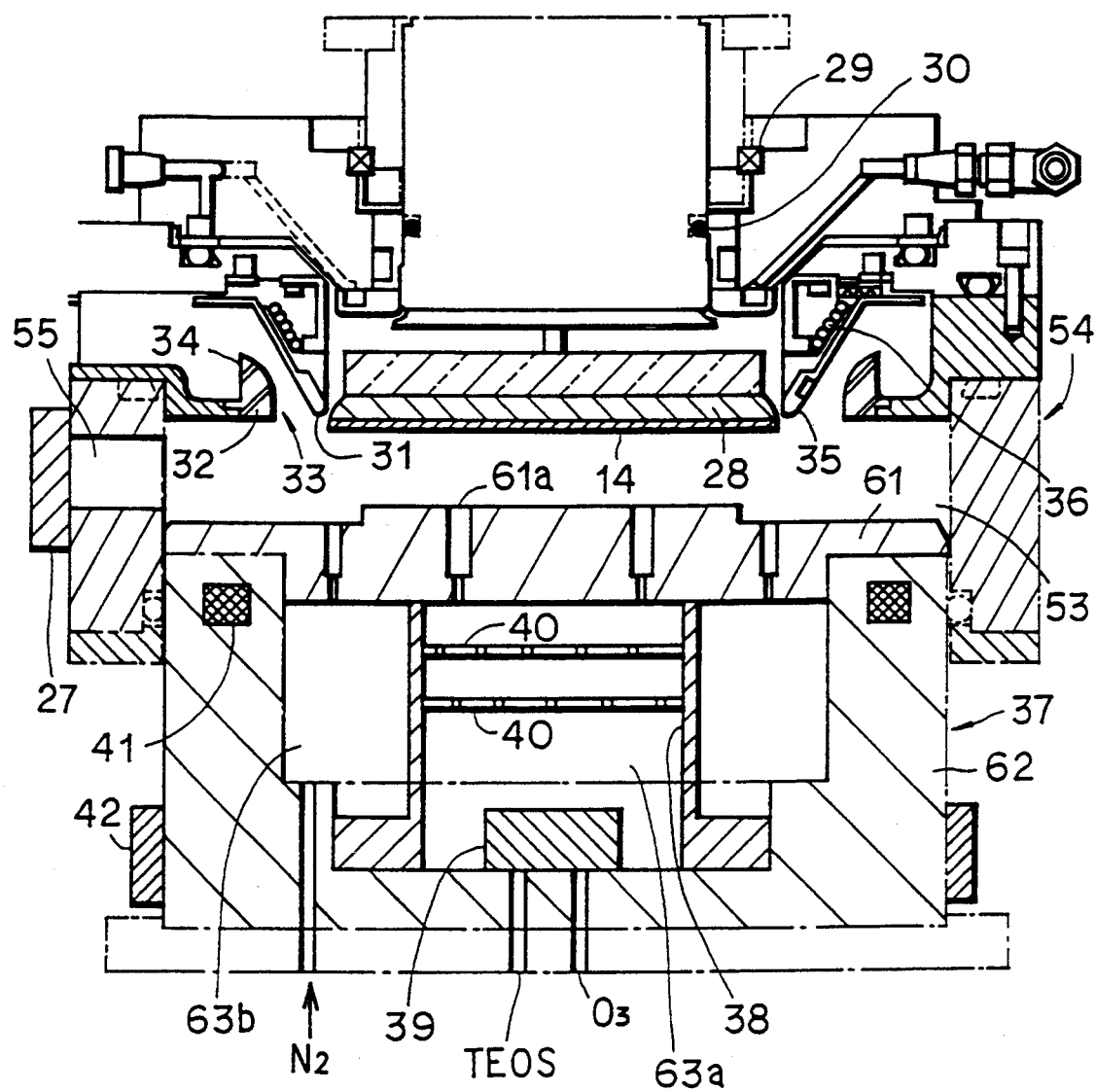
FIG. 13 is a sectional view of a single wafer reaction chamber according to an embodiment of the present invention.

The two single wafer reaction chambers 20a and 20b have an identical structure. FIG. 13 is a sectional view of a single wafer reaction chamber 20a or 20b. The single reaction chamber has a sealed structure as shown in FIG. 13. The single wafer reaction chamber includes a wafer heating stage 28 for holding a wafer 14 with the surface thereof downwards and for heating wafer 14. Wafer heating stage 28 rotates about the center of the stage. In a low position opposing wafer heating stage 28, a gas supplying head 37 for supplying reaction gas towards wafer heating stage 28 is provided to form a constant spacing region 53. The single wafer reaction chamber includes a reaction chamber forming member 54 surrounding in a circumferential direction the spacing region 53 between wafer heating stage 28 and gas providing head 37 to form a sealed reaction chamber. An exhaust outlet 33 is formed in reaction chamber forming member 54 and along the entire perimeter of wafer heating stage 28 having a configuration so as to discharge gas in the reaction chamber upwards obliquely. A gate 55 is provided in reaction chamber forming member 54 to input/output a wafer. The open and close of gate 55 is carried out by a gate shutter 27.

Figure 14:
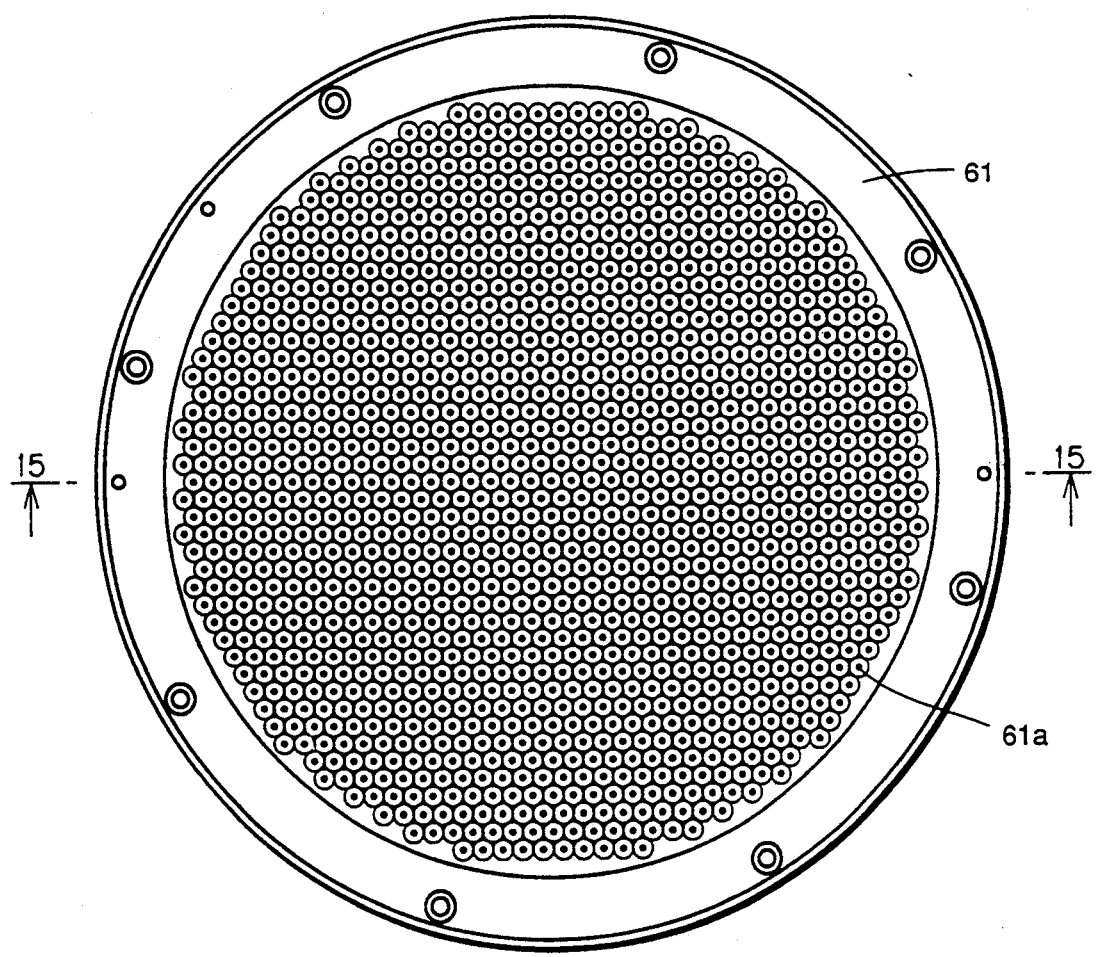
FIG. 14 is a plan view of a blow out plate of a gas supplying head.
Figure 15:
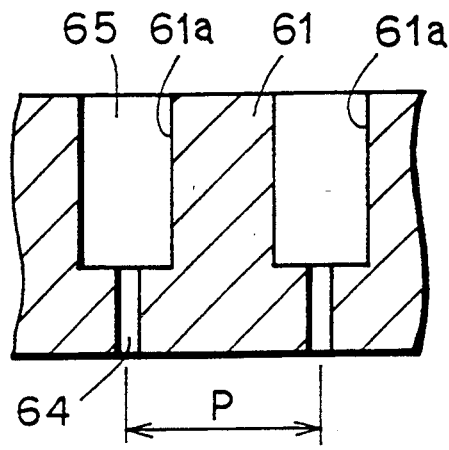
FIG. 15 is a sectional view taken along line A—A of FIG. 14.

Exhaust outlet 33 is formed of an exhaust upper ring 31 provided at the upper portion of spacing region 53 so as to surround wafer heating stage 28, and an exhaust lower ring 32. There is a constant distance between exhaust upper ring 31 and exhaust lower ring 32. Exhaust lower ring 32 is provided with a projection 34 for preventing a reverse flow of exhaust gas. The holding face of wafer heating stage 28 for holding a wafer 14 is substantially equal to the main surface of the wafer 14. Wafer heating stage 28 is made of a molybdenum material having high thermal conductivity. Therefore, wafer 14 can be heated uniformly by wafer heating stage 28. Wafer heating stage 28 incorporates a heater and has an adsorption groove for holding a wafer by vacuum adsorption. A bearing 29 for rotating the stage and a seal material 30 for maintaining the rotation portion in an air-tight manner are provided. Exhaust upper ring 31 includes a detachable metal cover 35 and a heater 36 for heating metal cover 35 from the other side. Reaction products adhered to metal cover 35 can be removed by detaching only metal cover 35 to carry out cleaning by etching and the like. Gas supplying head 37 includes a blow out plate 61 having a plurality of gas exhaust nozzles 61a, and a room forming member 62 supporting blow out plate 61 from below to form a room with blow out plate 61. This room is divided into an inner room 63a and an outer room 63b surrounding inner room 63a by a partition wall ring 38. Reactive gas (TEOS, $O_3$) is supplied to inner room 63a. $N_2$ gas is supplied to outer room 63b. A plurality of gas exhaust nozzles 61a are provided in blow out plate 61 in fine disposition in a range to sufficiently cover wafer 14, as shown in FIG. 14. FIG. 15 is a sectional view taken along line A—A of FIG. 14. Referring to FIG. 15, the configuration of exhaust nozzle 61a is a combination of a small hole 64 and a big hole 65 to maintain the blow out flow from each hole at a constant rate, to supply thoroughly diffused gas to the surface of a wafer, and to prevent drifting of the flow. The pitch P of holes 64 and 65 is preferably 6mm with optimum diameters of 1.5 mm and 5.5 mm of holes 64 and 65, respectively.

Referring to FIG. 13, a mixer 39 is provided in inner room 63a to mix at least two types of reaction gases introduced in inner room 63a.

Figure 16:
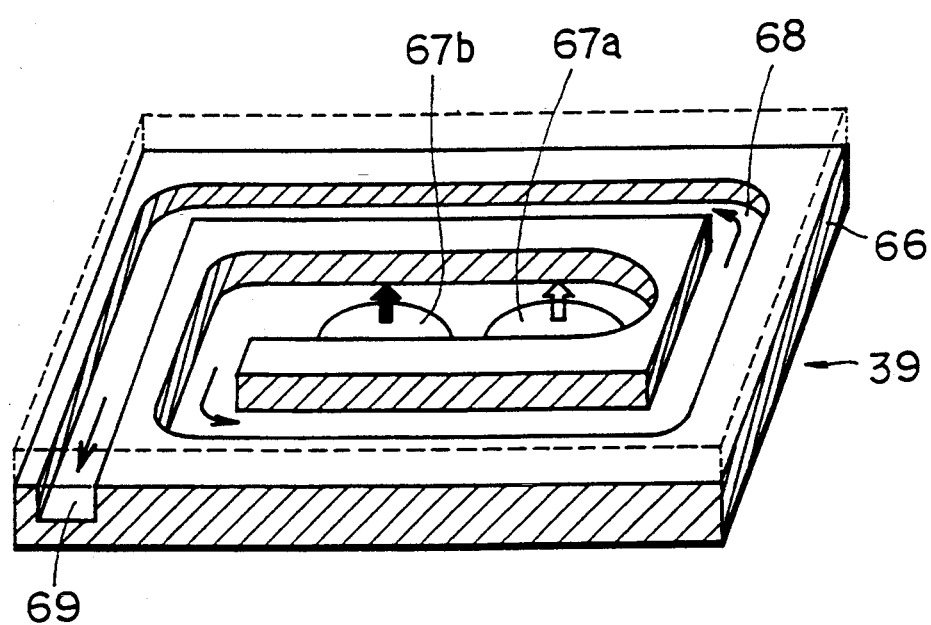
FIG. 16 is a perspective view of a mixer provided in a gas supplying head.

Referring to FIG. 16, mixer 39 is implemented with a plate 66. At least two gas inlets 67a and 67b for introducing two types of reaction gases are provided in plate 66. A passage 68 is formed in plate 66 through which respective gases entering from the two gas inlets 67a and 67b are combined to flow. At the terminal end of the winding passage 68, a discharge outlet 69 for sending the gas flowing through passage 68 into the inner room is provided. The gas entering mixer 39 flows through passage 68 to be thoroughly mixed by the eddy flow generated at the bending corners of the passage 68.

Referring to FIG. 13, reaction gas mixed by mixer 39 is rectified by diffusion plate 40 to be supplied over wafer 14 via exhaust nozzles 61a.

A cooling water passage 41 and a heat retaining heater 42 are provided in room forming member 62, whereby the inner wall of room forming member 62 is maintained at a constant temperature.

The distance between wafer heating stage 28 and gas supplying head 37 is variable so that a holding pan of wafer convey robot WB can be inserted and so that the distance therebetween can be changed during a film deposition process. This distance can be changed by moving gas supplying head or wafer heating stage 28, vertically.

The gas supplying system will be described hereinafter. The case will be described where three types including an alcoholate type liquid source of tetraethoxy silane (TEOS), trimethyl-ortho-phosphate (TMPO) for doping, and triethyl borate (TEB) are used, and where $N_2$ gas as carrier gas is used.

Figure 17:
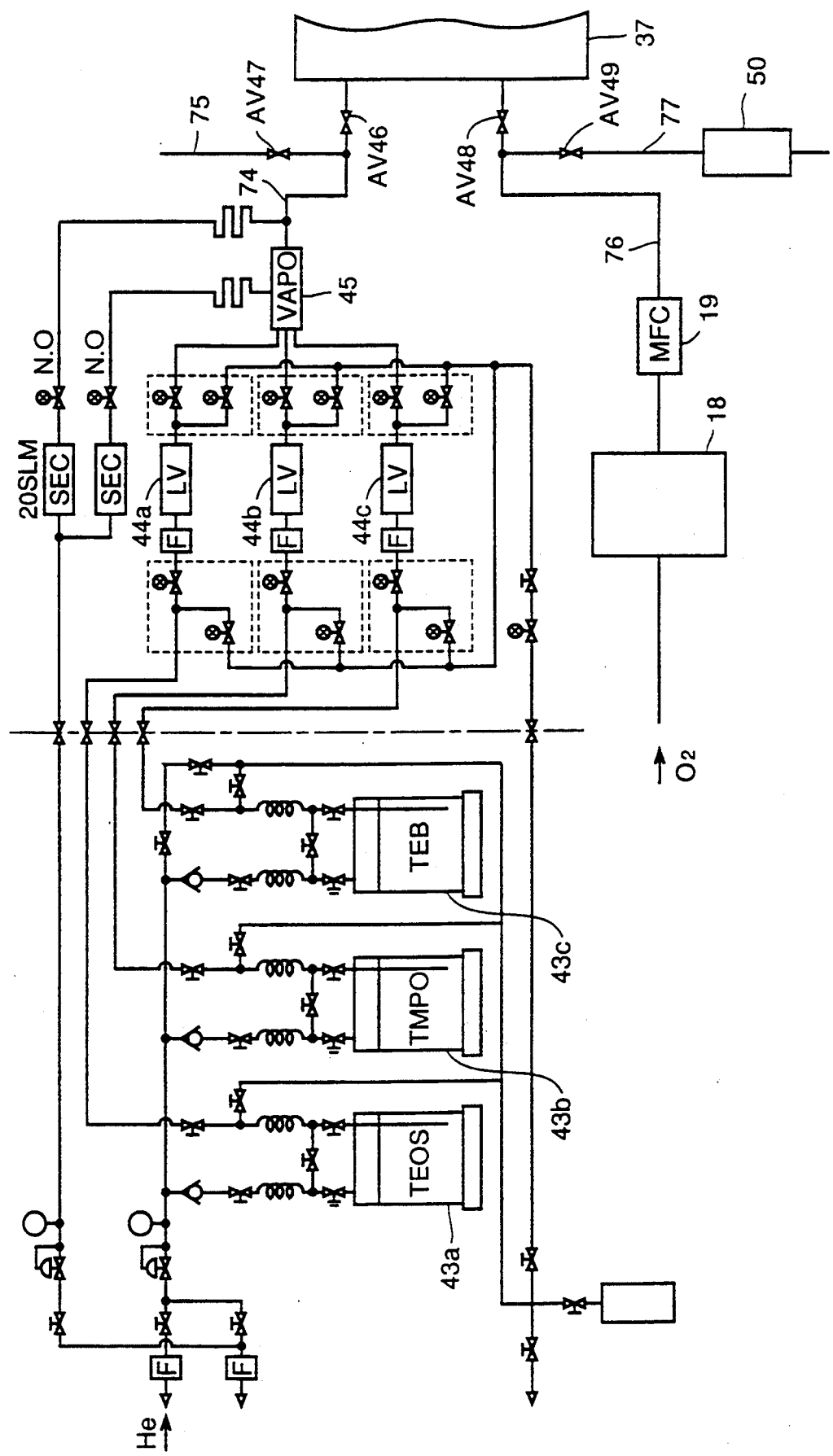
FIG. 17 schematically shows a gas supplying system used in the present invention.
Figure 18:
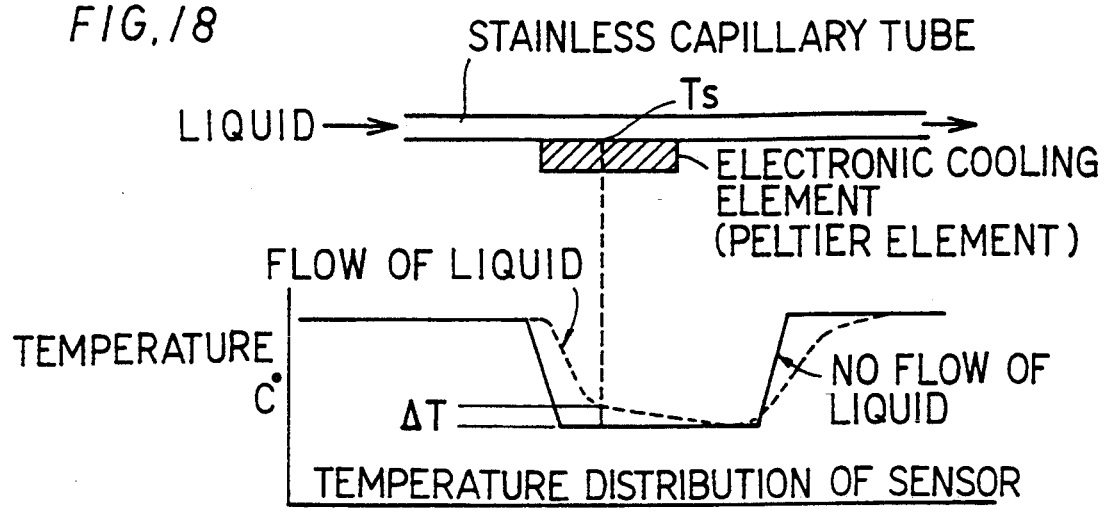
FIG. 18 is a diagram showing the principle of a liquid mass flow controller used in the present invention.

FIG. 17 schematically shows a gas supplying system. Material tank 43a contains liquid TEOS. Liquid mass flow controller 44a measures the mass and flow rate accurately of liquid TEOS from material tank 43a and provides the liquid to vaporizer 45. Material tank 43b contains liquid TMPO. Liquid mass flow controller 44b measures precisely the mass and flow rate of liquid TMPO, and provides the same to vaporizer 45. Material tank 43c contains liquid TEB. Liquid mass flow controller 44c measures accurately the mass and flow rate of liquid TEB to provide the liquid to vaporizer 45. Each of liquid mass flow controllers 44a, 44b and 44c measures precisely the critical mass and flow rate of the liquid source to provide the same utilizing the phenomenon of heat being derived in accordance with mass and flow. Regarding TMPO and TEB, the practical flow is 0.01–0.05 cc/minute in liquid state. Because this value is too low in comparison with the full scale (1 cc/minute) of a liquid mass flow controller, it is diluted with ethanol to increase the flow in the liquid mass flow controller. In general, TEPO/ethanol=1/5 (weight ratio), and TEB/ethanol=1/5 (weight ratio).

Vaporizer 45 vaporizes liquids TEOS, TMOP, and TEB conveyed from liquid mass flow controllers 44a, 44b, and 44c, respectively, by heat and carrier gas $N_2$.

Figure 19:
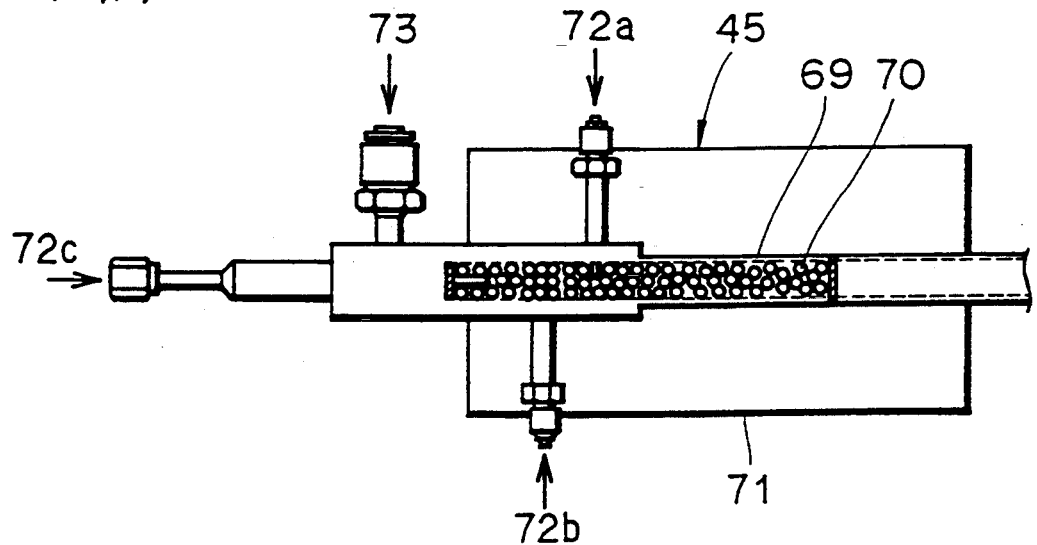
FIG. 19 is a partial broken diagram of a vaporizer used in the present invention.

Referring to FIG. 19, vaporizer 45 includes a vessel 69 filled with metal spheres 70. Heater 71 is provided around vessel 69. Three types of liquid sources are introduced into vessel 69 via inlets 72a, 72b, and 72c. Carrier gas is also introduced into vessel 69 via carrier gas inlet 73. The three types of liquid sources are vaporized in combination within vessel 69.

Referring to FIG. 17, the vaporized three types of liquid sources have carrier gas $N_2$ added to be provided to gas supplying head 37 through a first pipe 74 that is heated and held at a constant temperature. A vent line 75 is connected to a first pipe 74. Air valves 46 and 47 are provided in first pipe 74 and vent line 75, respectively. By switching air valves 46 and 47, gas is provided to the gas supplying head at the time of film deposition, and otherwise exhausted from vent line 75.

$O_2$ gas is supplied to ozone generator 18 where a portion is converted into $O_3$ by silent discharge and the like. $O_2$ gas including $O_3$ is measured precisely by mass flow meter 19, followed by the addition of carrier gas $N_2$. The gas flows through a second pipe 76 to be sent to gas supplying head 37. A vent line 77 is connected to second pipe 76. Air valves 48 and 49 are provided in second pipe 76 and vent line 77, respectively. A catalytic type ozone processor 50 is connected to vent line 77 for converting the $O_3$ component into $O_2$. By the switching operations of air valves 48 and 49, oxygen gas including ozone is supplied to gas supplying head 37 at the time of film deposition, and otherwise is discharged through ozone processor 50 from vent line 77.

A portion of gas in ozone generator 18 is provided to an ozone monitor (not shown) to have its concentration measured. In the ozone monitor, the ozone concentration is precisely measured by light absorption.

A method of forming a thin film on a wafer using the above-described chemical vapor deposition apparatus will be described hereinafter. Referring to FIG. 9, wafer convey robot WA picks up a wafer to have a film deposited from a wafer cassette mounted on cassette stage K1 disposed in cassette station unit 22. Wafer convey robot WA holds a wafer by a vacuum absorption method to convey the same to means 24 for setting the orientation flat (referred to as OF means 24 hereinafter). The orientation flat angle and position of a wafer is determined accurately by OF means 24. The positioning by OF means 24 is critical to determined the adsorption accuracy of a wafer on wafer heating stage 28. The angle and position of an orientation flat is determined at an accuracy within the range of ±0.2 mm by OF means 24.

The wafer having the angle and position of its orientation flat determined accurately is vacuum-adsorbed by wafer convey robot WA to be carried to wafer stage 26a exclusively functioning to convey a wafer to single wafer reaction chambers 20a and 20b. Here, the wafer has its top and bottom reversed by the function of wafer rotation (rotating in the direction of arrow 51 in FIG. 10). More specifically, the wafer is held by a pan 59 with the surface downwards with no contact of the product surface.

The wafer mounted on wafer stage 26a is inserted into single wafer reaction chamber 20a by wafer convey robot WB having a retractable arm using the mechanism of a parallel link. The wafer is conveyed to wafer heating stage 28 and held in a vacuum adsorption manner on the stage. Pan 59 of wafer convey robot WB has a configuration to hold a wafer as shown in FIG. 12 with the surface thereof downwards without contacting the middle portion of the surface of the wafer product. When a wafer is picked up by wafer stage 26a to be inserted into single wafer reaction chamber 20a, the distance between wafer heating stage 28 and gas supplying head 37 is spaced so that pan 59 of wafer convey robot WB can be inserted. Wafer heating stage 28 has an holding face substantially equal to the main surface of wafer 14. Therefore, when the wafer is accurately held on the holding face of wafer heating stage 28, there will be no area on the surface of the high temperature stage which is subjected to reaction gas. This means that an undesired film does not adhere to wafer heating stage 28.

After the wafer is held by vacuum adsorption on wafer heating stage 28, the distance between wafer heating stage 28 and gas supplying head 37 is reduced to a predetermined distance required for film deposition.

Film deposition is carried out by supplying $N_2$ gas including TEOS, TMPO, and TEB, and $O_3$ gas to a wafer 14 heated to a high temperature.

Referring to FIG. 17, liquid TEOS in material tank 43a is provided to liquid mass flow controller 44a by the pressure of He gas. Liquid mass flow controller 44a measures accurately the mass and flow of liquid TEOS to supply the same to vaporizer 45. In the present embodiment, the required amount of TEOS is approximately 0.2 cc/minutes in a liquid state. Liquids TMPO and TEB diluted with ethanol in material tanks 43b and 43c, respectively, are provided to liquid mass flow controllers 44b and 44c by the pressure of He gas to have the flow rate measured and then provided to vaporizer 45. The reason why He gas is used to apply pressure to the liquid source is to suppress to a minimum the generation of bubbles after passing through the liquid mass flow controller by suppressing the amount of vapor dissolved into the liquid source to a minimum.

Liquid TEOS, TMPO, and TEB measured and provided from liquid mass flow controllers 44a, 44b, and 44c, respectively, are combined to be vaporized by heat and carrier gas $N_2$ after being conveyed to vaporizer 45.

The vaporized three types of liquid sources have carrier gas $N_2$ added, and then flows through pipe 74 heated and maintained at a temperature to be provided to gas supplying head 37.

At the time of film deposition, air valves 47 and 49 are closed and air valves 46 and 48 are opened, whereby $N_2$ gas including TEOS and $O_2$ gas including $O_3$ are supplied to inner room 63a as shown in FIG. 13. These gases are mixed thoroughly by mixer 39 to be rectified by diffusion plate 40 to be provided to wafer 14 through exhaust nozzle 61a. $N_2$ gas is always supplied to outer room 63b.

The flow within the chamber during film deposition is described in detail with reference to FIG. 13. Wafer heating stage 28 rotates about the center of the stage to facilitate uniformity of the film thickness. The exhaust gas after being supplied to wafer 14 is discharged uniformly from exhaust outlet 33 provided around the whole perimeter of wafer heating stage 28 and having a configuration to discharge the gas in reaction chamber 53 upwards obliquely. The discharged gas does not flow back into the chamber by projection 34 provided along the entire perimeter of wafer stage 28.

Figure 20:
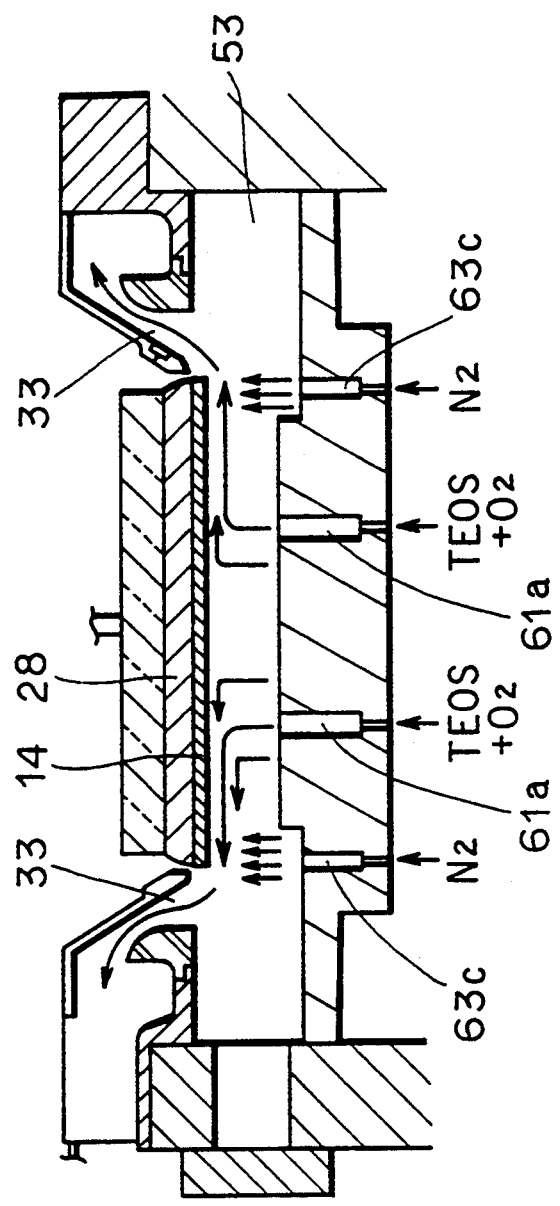
FIG. 20 is an enlarged view in the proximity of the reaction chamber of the single wafer reaction chamber of FIG. 13, schematically showing the manner of gas flow therein.

FIG. 20 is a diagram schematically showing the gas flow in reaction chamber 53. TEOS+$O_2$ gas enters reaction chamber 53 from exhaust nozzle 61a to collide against the face of wafer 14. Then, the gas moves in a horizontal direction along the face of wafer 14 to be discharged from exhaust outlet 33. $N_2$ gas blown out from $N_2$ gas supplying outlet 63c provided to surround the region where exhaust nozzles 61a are provided causes the TEOS+$O_2$ gas moving along the surface of wafer 14 to be moved against the face thereof. The TEOS+$O_2$ gas contacting the surface of wafer 14 is promptly discharged from exhaust outlet 33 without remaining within chamber 53. Therefore, the flow of gas in the reaction chamber is constant to make stable the film deposition conditions.

The present apparatus is configured so that inert gas flows uniformly into reaction chamber 53 from the space between wafer heating stage 28 and exhaust upper ring 31, as shown in FIG. 13. Therefore, reaction gas will not flow into the space portion between wafer heating stage 28 and exhaust upper ring 31, so that there is no film deposition on the bottom side of wafer 14.

Referring to FIGS. 17 and 13, air valves 46 and 48 are closed and air valves 47 and 49 are opened when the film deposition step is completed. Therefore, the supply of $N_2$ gas including TEOS and $O_3$ gas toward the single wafer reaction chamber is ceased. The carrier gas carrying and $N_2$ gas to outer room 63b of gas supplying head 37 are continuously supplied, whereby the interior of the single wafer reaction chamber is substituted with inert gas. After the substitution of the interior of the single wafer reaction chamber with inert gas, the distance between wafer heating stage 28 and gas supplying head 37 is increased, and gate shutter 27 is opened. The wafer-holding pan of wafer convey robot WB is inserted into the chamber to cancel the vacuum adsorption of a wafer. Wafer 14 with its surface downwards is conveyed to wafer stage 26b. The wafer carried to wafer stage 26b is left to be cooled to a temperature that does not deform the wafer cassette. The cooled wafer is held by vacuum adsorption by wafer convey robot WA to be inserted into the former slit in the cassette mounted on cassette stage K1 disposed in cassette station unit 22. Because the apparatus of the present embodiment processes a semiconductor wafer one by one, it is possible to carry out film deposition under a different condition for each wafer. Also, by changing conditions during film deposition, the quality in the thickness direction of a film can be controlled in an arbitrary manner.

The single wafer reaction chamber having a wafer removed is supplied with the next wafer to be processed by wafer convey robot WB to carry out film deposition.

Thus, a uniform deposition film of high accuracy is obtained stably for each wafer.

In the above embodiment, liquid TEOS was diluted to 10% by alcohol because the required amount of material is approximately 0.05 cc/minutes in a liquid state, the full scale of the liquid mass flow controller is 1 cc/minutes, and the accuracy of the full scale is ±2%. This amount of dilution can be changed if necessary. The liquid reaction material can be diluted to any amount as long as the liquid mass flow controller is used approximating a full scale.

The present invention is not limited to the above-described embodiment where TEOS is used as the liquid reaction material, and any liquid material can be used as long as it vaporizes and reacts. Also, the liquid material for doping impurities into the film can include trimethyl-ortho-phosphate and trimethyl borate.

Although ethyl alcohol is described as the diluting alcohol in the above embodiment, any alcohol can be used because alcoholate type liquid material is generally soluble in alcohol.

Also, the present invention is not limited to the above embodiment where $N_2$ gas is used as carrier gas, and any inert gas suitable for chemical vapor deposition can be used.

Furthermore, the present invention is not limited to the above embodiment where $O_3$ gas is used as the gas to react with the reaction material, and $O_2$ gas or $NO_2$ gas may be used depending upon the liquid source. These gases may be dispensable depending upon the temperature of the wafer.

As described above, the reaction chamber for a chemical vapor deposition apparatus according to an aspect of the present invention has an exhaust outlet provided in the reaction chamber such that gas within the reaction chamber is discharged upwards obliquely, whereby reaction gas entering the reaction chamber collides against the wafer face and travels in a horizontal direction to be promptly discharged from the exhaust outlet. The reaction gas will promptly be discharged from the exhaust outlet without remaining in the reaction chamber, so that the gas flow in the reaction chamber is constant, resulting in a stable film deposition condition. A uniform deposited film of high accuracy can be obtained stably for every wafer. Also, contamination in the chamber is reduced.

The chemical vapor deposition apparatus according to another aspect of the present invention has two single wafer reaction chambers and four product cassette stages, so that a wafer can be processed efficiently with a minimum area. Furthermore, the state of film deposition can be easily checked because a monitor cassette stage is provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A reaction chamber for a chemical vapor deposition apparatus comprising:
   a wafer heating stage for holding a wafer with its surface downwards, and for heating said wafer, said wafer heating stage rotatable about the center of said stage,
   a gas supplying head provided under and facing opposite said wafer heating stage to form a constant spacing region for supplying reaction gas towards said wafer heating stage,
   a reaction chamber forming member surrounding in a circumferential direction said spacing region between said wafer heating stage and said gas supplying head for establishing said reaction chamber having said spacing region closed, and
   an exhaust outlet provided in said reaction chamber forming member and along the entire circumference of said wafer heating stage to discharge the gas in said reaction chamber upwards and obliquely,
   wherein said exhaust outlet comprises an exhaust upper ring provided at the upper portion of said spacing region and surrounding said wafer heating stage, and an exhaust lower ring, said exhaust upper ring and said exhaust lower ring having a constant distance therebetween, and wherein said exhaust lower ring comprises reverse flow preventing means for preventing a reverse flow of exhaust gas.

2. A reaction chamber for a chemical vapor deposition apparatus comprising:
   a wafer heating stage for holding a wafer with its surface downwards, and for heating said wafer, said wafer heating stage rotatable about the center of said stage,
   gas supplying head provided under and facing opposite said wafer heating stage to form a constant spacing region for supplying reaction gas towards said wafer heating stage,
   a reaction chamber forming member surrounding in a circumferential direction said spacing region between said wafer heating stage and said gas supplying head for establishing said reaction chamber having said spacing region closed, and
   an exhaust outlet provided in said reaction chamber forming member and along the entire circumference of said wafer heating stage to discharge the gas in said reaction chamber upwards and obliquely, wherein said wafer heating stage is formed of molybdenum.

3. A reaction chamber for a chemical vapor deposition apparatus comprising:
   a wafer heating stage for holding a wafer with its surface downwards, and for heating said wafer, said wafer heating stage rotatable about the center of said stage,
   a gas supplying head provided under and facing opposite said wafer heating stage to form a constant spacing region for supplying reaction gas towards said wafer heating stage,
   a reaction chamber forming member surrounding in a circumferential direction said spacing region between said wafer heating stage and said gas supplying head for establishing said reaction chamber having said spacing region closed, and
   an exhaust outlet provided in said reaction chamber forming member and along the entire circumference of said wafer heating stage to discharge the gas in said reaction chamber upwards and obliquely, wherein said exhaust outlet comprises an exhaust upper ring having a removable metal cover, and a heater for heating said metal cover from the other side.

4. A reaction chamber for a chemical vapor deposition apparatus comprising:

a wafer heating stage for holding a wafer with its surface downwards, and for heating said wafer, said wafer heating stage rotatable about the center of the stage, a gas supplying head provided under and facing opposite said wafer heating stage to form a constant spacing region for supplying reaction gas towards said wafer heating stage, a reaction chamber forming member surrounding in a circumferential direction said spacing region between said wafer heating stage and said gas supplying head for establishing a reaction chamber having said spacing region closed, and an exhaust outlet provided in said reaction chamber forming member and along the entire circumference of said wafer heating stage to discharge the gas in said reaction chamber upwards and obliquely, wherein said gas supplying head comprises a blow out plate having a plurality of gas exhaust nozzles, a room forming member supporting said blow out plate from the bottom so as to form a room with said blow out plate, and a partition wall ring dividing said room into an inner room and outer room surrounding said inner room, wherein reactive gas is supplied to said inner room, and inert gas is supplied to said outer room, and wherein said inner room comprises mixing means for mixing at least two types of reaction gases introduced into said inner room.

5. A reaction chamber for a chemical vapor deposition apparatus comprising:

a wafer heating stage for holding a wafer with its surface downwards, and for heating said wafer, said wafer heating stage rotatable about the center of the stage, a gas supplying head provided under and facing opposite said wafer heating stage to form a constant spacing region for supplying reaction gas towards said wafer heating stage, a reaction chamber forming member surrounding in a circumferential direction said spacing region between said wafer heating stage and said gas supplying head for establishing said reaction chamber having said spacing region closed, and an exhaust outlet provided in said reaction chamber forming member and along the entire circumference of said wafer heating stage to discharge the gas in said reaction chamber upwards and oblique, wherein said gas supplying head comprises a blow out plate having a plurality of gas exhaust nozzles, a room forming member supporting said blow out plate from the bottom so as to form a room with said blow out plate, and a partition wall ring dividing said room into an inner room and outer room surrounding said inner room, wherein reactive gas is supplied to said inner room, and inert gas is supplied to said outer room, wherein said inner room comprises mixing means for mixing at least two types of reactions gases introduced into said inner room, and wherein said mixing means is formed of a plate, said plate including at least two gas inlets for introducing said two types of reaction gases, a winding passage through which said reaction gases separately entering from said two gas inlets flow in combination, and a discharge outlet provided at the terminal of said winding passage to send said reaction gas through said passage into said inner room.

6. A reaction chamber for a chemical vapor deposition apparatus comprising:

a wafer heating stage for holding a wafer with its surface downwards, and for heating said wafer, said wafer heating stage rotatable about the center of the stage, a gas supplying head provided under and facing opposite said wafer heating stage to form a constant stage region for supplying reaction gas towards said wafer heating stage, a reaction chamber forming member surrounding in a circumferential direction said spacing region between said wafer heating stage and said gas supplying head for establishing said reaction chamber having said spacing region closed, and an exhaust outlet provided in said reaction chamber forming member and along the entire circumference of said wafer heating stage to discharge the gas in said reaction chamber upwards and obliquely, wherein said gas supplying head comprises a blow out plate having plurality of gas exhaust nozzles, a room forming member supporting said blow out plate from the bottom so as to form a room with said blow out plate, and a partition wall ring dividing said room into an inner room and outer room surrounding said inner room, wherein reactive gas is supplied to said inner room, and inert gas is supplied to said outer room, wherein said inner room comprises mixing means for mixing at least two types of reactions gases introduced into said inner room, and wherein said inner room comprises a diffusion plate for diffusing the gas sent from said mixing means to said inner room for guiding said gas to a blow out plate.

7. A reaction chamber for a chemical vapor deposition apparatus comprising:

a wafer heating stage for holding a wafer with its surface downwards, and for heating said wafer, said wafer heating Stage rotatable about the center of said stage, a gas supplying head provided under and facing opposite said wafer heating stage to form a constant spacing region for supplying reaction gas towards said wafer heating stage, a reaction chamber forming member surrounding in a circumferential direction said spacing region between said wafer heating stage and said gas supplying head for establishing said reaction chamber having said spacing region closed, and an exhaust outlet provided in said reaction chamber forming member and along the entire circumference of said wafer heating stage to discharge the gas in said reaction chamber upwards and obliquely, wherein said gas supplying head comprises a blow out plate having a plurality of gas exhaust nozzles, a room forming member supporting said blow out plate from the bottom so as to form a room with said blow out plate, and a partition wall ring dividing said room into an inner room and outer room surrounding said inner room, wherein reactive gas is supplied to said inner room, and inert gas is supplied to said outer room, and wherein said room forming member comprises cooling means for cooling the inner wall of said room forming member, and heat-holding means for maintaining the heat of the inner wall of said room forming member.

* * * * *